United States Patent [19]

Amann

[11] Patent Number: 5,048,049
[45] Date of Patent: Sep. 10, 1991

[54] TURNABLE DISTRIBUTED FEEDBACK-LASER

[75] Inventor: Markus C. Amann, Munich, Fed. Rep. of Germany

[73] Assignee: Siemens Aktiengesellschaft, Munich, Fed. Rep. of Germany

[21] Appl. No.: 629,017

[22] Filed: Dec. 18, 1990

Related U.S. Application Data

[63] Continuation of Ser. No. 408,560, Sep. 18, 1989, abandoned.

[30] Foreign Application Priority Data

Sep. 22, 1988 [DE] Fed. Rep. of Germany ....... 3832240

[51] Int. Cl.$^5$ ............................................... H01S 3/08
[52] U.S. Cl. ........................................ 372/96; 372/20; 372/46; 372/47; 372/50
[58] Field of Search ...................... 372/96, 46, 20, 47, 372/50

[56] References Cited

U.S. PATENT DOCUMENTS

| | | | |
|---|---|---|---|
| 4,318,059 | 3/1982 | Long et al. | 372/47 |
| 4,607,370 | 8/1986 | Mukai et al. | 372/50 |
| 4,644,553 | 2/1987 | Van Ruyven et al. | 372/46 |
| 4,665,527 | 5/1987 | Akiba et al. | 372/96 |
| 4,719,636 | 1/1988 | Yamaguchi | 372/20 |
| 4,720,835 | 1/1988 | Akiba et al. | 372/50 |
| 4,720,836 | 1/1988 | Fukuzawa et al. | 372/96 |
| 4,802,187 | 1/1989 | Bouley et al. | 372/20 |
| 4,817,105 | 3/1989 | Yano | 372/50 |

FOREIGN PATENT DOCUMENTS

| | | |
|---|---|---|
| 0065818 | 7/1986 | European Pat. Off. |
| 0261408 | 3/1988 | European Pat. Off. |
| 3434741 | 4/1986 | Fed. Rep. of Germany |
| 3605130 | 8/1986 | Fed. Rep. of Germany |
| 3144628 | 10/1987 | Fed. Rep. of Germany |
| 3708666 | 9/1988 | Fed. Rep. of Germany |
| 0128589 | 6/1986 | Japan |

OTHER PUBLICATIONS

Kuo et al., "Characteristics of Two-Electrode DFB Laser", Electronics Letters, Jul. 21, 1988, vol. 24, No. 15, pp. 947-949.

PCT-WO88/06360, Westbrook et al., "Semiconductor Laser Structure", Aug. 25, 1988, pp. 1-20.

The Article Electronics Letter of Jul. 21, 1988, vol. 24, No. 15, entitled "Characteristics of Two-Electrode DFB Lasers"-by C. Y. Kuo and N. K. Dutta.

Siemens Forsch.—u. Entwicki, Ber. Bd. 17 (1988) No. 1, "Planar Buried-Ridge-Structure (PBRS) Lasers with Emission Wavelengths of 1.3 um and 1.55 um for Optical Communications Systems" by Thulke, Zach and Wolf.

Primary Examiner—Georgia Epps
Attorney, Agent, or Firm—Hill, Van Santen, Steadman & Simpson

[57] ABSTRACT

A tunable distributed feedback laser which has an active region and a tuning region which are arranged transversely relative to each other and which can be separately driven in common via a central layer 4.

20 Claims, 1 Drawing Sheet

TURNABLE DISTRIBUTED FEEDBACK-LASER

This is a continuation of application Ser. No. 408,560, filed Sept. 18, 1989 now abandoned.

BACKGROUND OF THE INVENTION

1. Field of the Invention

The invention relates to a tunable DFB-laser.

2. Description of Related Art

Single-wave (single-frequency) laser diodes which have continuously tunable wavelengths over a certain range (for example, 0.5–1nm given a 1.55um wavelength) are a preferred requirement for modern optical communications systems.

The manufacture of appropriate, single-wave laser diodes currently occurs almost exclusively using the principal of distributed feedback. These lasers are referred to as distributed feedback (DFB) or distributed Bragg reflector (DBR) lasers. The tuning of the wavelength has been produced by modifying the refractive index in the region of the Bragg grating (or, respectively, of the Bragg wavelength). For this reason, the lasers are longitudinally divided into a plurality of sections and are provided with separate electrodes. A critical disadvantage of these configurations (as discussed, for example, in the article by C. Y. Kuo, N. K. Dutta, "Characteristics of Two-Electrode DFB Lasers", Electronic Letters 24, 947–949 (1988)) is caused by inhomogeneities or, respectively, discontinuities in the tuning (longitudinal mode change). This disadvantage can be avoided by additional application of a third section or, respectively, of a fourth electrode. However, the division of the currents into the three sections must occur within narrow limits that are located using an extremely involved measuring technique. This type of operation is extremely critical in practice and component aging can lead to mode changes since the division of the currents can unpredictably change after a few thousand operating hours.

SUMMARY OF THE INVENTION

It is an object of the present invention to specify a format for a tunable DFB laser which is simple to manufacture and simple to provide contacts.

The present invention solves the problem of continuous tuning because it does not use longitudinal segmenting, but uses transversal segmenting of the laser. This invention is based on the realization that no inhomogeneity due to change of the longitudinal modes fundamentally occurs with transversal tuning. What results with such a laser structure is the technical problem of separating the emission-generating region from the region provided for the tuning, of enabling a separate drive while simultaneously achieving effective tuning. The present invention solves this problem by using a central layer located between the tuning region and the active region and by which the two regions can be driven by the applied voltages. The actual DFB laser is located on a substrate that is doped oppositely to the conductivity type of the central layer. A tunable layer is arranged on the opposite side of the central layer in proximity to the active layer. Due to the transversal arrangement of the active layer and the tuning layer, the structure of the invention enables accurate tuning of the laser.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
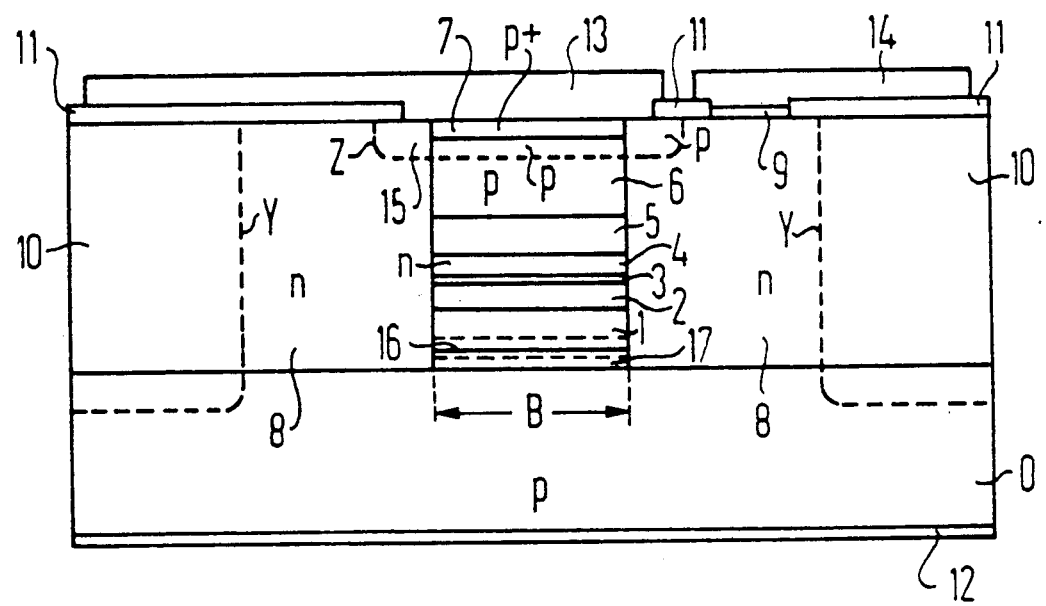
Figure 1A:
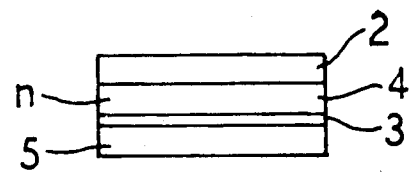

The FIG. 1 shows an exemplary embodiment. FIG. 1a shows a modification. A substrate contact 12 of metal is located on one principal side of a substrate 0 and a strip-shaped, etched layer sequence of semiconductor materials are located on the opposite principal side. The layer sequence is composed of a first buffer layer 17 and then a grating layer 1 and their common boundary surfaces form the grating 16. An active layer 2 is formed on layer 1, then an antimelt-back layer 3. A central layer 4 is formed on layer 3 and a tuning layer 5, a cover layer 6, and a main contact layer 7 are then sequentially formed. The lateral regions 8 which extend outwardly are limited by passivation regions 10 located laterally from the strip-shaped layer format. The antimelt-back layer 3 and the main contact layer 7 can be eliminated under certain conditions. The grating layer 1 can also be eliminated. The grating 16 is then integrated in the tuning layer 5, and the tuning layer 5 is constructed of two layers which have different refractive indices. The arrangement of the tuning layer 5 and of the active layer 2 can also be interchanged, i.e. the tuning layer 5 can be located directly on the substrate O and the active layer 2 can have the position of the tuning layer 5. This is shown in FIG. 1a.

The cover layer 6, or, respectively, the main contact layer 7 is provided with a middle metal contact 13 and at least one lateral region 8 is provided with a lateral contact 14. So as to make better contact, the lateral contact 14 can be applied on a highly doped, lateral contact layer 9 applied on the lateral region 8. The insulation of the contacts 13, 14 from the semiconductor material outside of the regions of the surface provided for contact occurs with a passivation layer 11.

The substrate O, buffer layer 17, central layer 4, cover layer 6 and the lateral regions 8 are made of InP. The remaining portions of the semiconductor material are preferably made of quaternary material such as InGaAsP.

For p-conduction, the substrate O, the grating layer 1, the cover layer 6, the buffer layer 17, the main contact layer 7 and, the tuning layer 5 are doped. For n-conduction, the central layer 4, the tuning layer 5, the lateral regions 8 and, when present, the lateral contact layer 9 are doped. The main contact layer 7 and the lateral contact layer 9 are respectively highly doped. The doping of all layers and of the substrate 0 can also be respectively undertaken with opposite conductivity type to form a complementary structure. However, the manufacturing method, set forth above are advantageous.

Greater precise particulars regarding the structure and dimension of the individual layers can be taken from the following table. The number at the top of column 1 indicates the reference numeral of the appertaining layer. The chemical compositions ch, wavelength corresponding to the band edge $1_g$, operation sign of the doping c, height of the doping d, the thickness th, and, for a typical exemplary embodiment, the wavelength $1_g$, the height of the doping d and the layer thickness th are also listed. The wavelength of 1.67um results for an InGaAs grating-matched to InP. This structure modification is based on the principal of the PBRS laser discussed in the article by W. Thulke, A. Zach, H.-D. Wolf, "Planar Buried-Ridge Structure (PBRS) Lasers With Emission Wavelengths of 1.3um and 1.55um for Optical Communications Systems", in Siemens Forschungs- Und Entwicklungsberichte 17, 1–5 (1988).

The transversal separation of the tuning region (tuning layer 5) and the intensification region active layer 2 occurs due to the thin n-InP layer (central layer 4) between the p-doped tuning layer 5 and the active layer 2. This central

TABLE 1

| No. of Layer | Chemical Composition | Wavelengths $l_g/\mu m$ | Doping c | Heighth of Doping $d/10^{18} cm^{-3}$ | Thickness $th/\mu m$ | Wavelength $l_g/\mu m$ | Heighth of Doping $d/10^{18} cm^{-3}$ | Thickness $th/\mu m$ |
|---|---|---|---|---|---|---|---|---|
| 0 | InP | 0.92 | p | 5 | 50 ... 200 | 0.92 | 5 | 80 |
| 1 | q | 1.0 ... 1.4 | p | 0 ... 1 | 0.1 ... 0.3 | 1.15 | — | 0.15 |
| 2 | q | 1.3 ... 1.67 | — | — | 0.05 ... 0.3 | 1.55 | — | 0.12 |
| 3 | q | 1.2 ... 1.4 | — | — | 0 ... 0.1 | 1.3 | — | 0.05 |
| 4 | InP | 0.92 | n | 0.1 ... 10 | 0.05 ... 0.5 | 0.92 | 1 | 0.1 |
| 5 | q | 1.1 ... 1.5 | p, n | 0 ... 1 | 0.05 ... 0.5 | 1.3 | — | 0.3 |
| 6 | InP | 0.92 | p | 0.1 ... 1 | 1 ... 3 | 0.92 | 0.4 | 1.5 |
| 7 | q | 1.1 ... 1.67 | p | 10 ... 100 | 0.05 ... 0.5 | 1.67 | 60 | 0.2 |
| 8 | InP | 0.92 | n | 0.3 ... 10 | 1.5 ... 5 | 0.92 | 1 | 2.5 |
| 9 | q | 1.1 ... 1.67 | n | 1 ... 50 | 0.05 ... 0.5 | 1.67 | 4 | 0.2 |
| 17 | InP | 0.92 | p | 0.1–2 | 0 ... 10 | 0.92 | 0.5 | 2 | q = InGaAsP
Width B is 0.5 - 10 $\mu m$, typically 2 $\mu m$.

layer 4 separates the hole injection into the active layer 2 from the hole injection into the tuning layer 5 and both layers can operate independently of each other, and i.e. can be supplied with separate voltages. The electrons flow in common over the lateral regions 8 of n-InP and the appertaining electrode and the lateral contact 14. The hole injection into the tuning layer 5 occurs from the electrode which is applied to the middle contact 13 through the main contact layer and the cover layer 6 each of which are formed of p-doped material. The hole injection into the active layer 2 for generating emission occurs through the substrate contact 12 and through the substrate, the buffer layer 17 and the grating layer 1.

Depending on the level of the hole injection into the tuning layer 5, the refractive index of the tuning layer 5 changes and, thus, the effective refractive index of the entire laser waveguide as well as the effective Bragg wavelength of the integrated grating 16 changes. The electron flow in the lateral regions 8 is late rally limited by their dimensioning. Shunt currents are partially avoided by the layers of passivation regions 10 which adjoin outwardly of the lateral regions 8. For example, these passivation regions 10 are produced by proton implantation or by p-diffusion into the material which laterally grown so as to form the lateral regions 8.

Both the active layer 2 as well as the tuning layer 5 can comprise structures required for the quantum well effect. Since a certain thickness is required for the functioning of these layers, the forming of a multi-quantum well structure is advantageous in the manufacture of such specific structures. This requires a succession of relatively extremely thin semiconductor layers of alternating binary and quaternary material. Another possibility of exploiting the quantum well effect and of simultaneously obtaining an adequately thick layer can be obtained by using separate confinement structure. In such structure, the actual layer, i.e. the layer 2 or, respectively, the tuning layer 5 in this case, is dimensioned appropriately for the quantum well effect and adjacent layers of semiconductor material which are continually varying energy band spacing toward the outside are grown above and below this extremely thin layer. When, in particular, the tuning layer 5 comprises a quantum well structure, improved tuning properties can be achieved by connecting the tuning layer 5 so that it is polarized for the quantum-confined Stark effect.

An equivalent tunable laser diode can be manufactured on an n-substrate using a modified layer sequence or a different system of semiconductor materials (such as, for example, AlGas-GaAs). A critical feature of the invention is the transversal parallel connection of two layers which have different band spacings into which separate current injection is possible for the purpose of changing the refractive index.

Although the invention has been described with respect to preferred embodiments, it is not to be so limited as changes and modifications can be made which are within the full intended scope of the invention as defined by the appended claims.

I claim as my invention:

1. A tunable distributive feedback of semiconductor material formed on a substrate which is doped for electrical conduction of a first conductivity type, comprising a strip-shaped sequence of semiconductor layers grown one upon another and comprising an active layer for generating emission, a tuning layer formed of a material which has a different energy band gap between the valency band and the conduction band from the material of said active layer, and a central layer doped for a conductivity type opposite to the conductivity type of said substrate and formed between said active layer and said tuning layer, comprising further a grating created by a boundary surface between two layer with different refractive indexes, and lateral regions joining said strip-shaped layer sequence laterally and being doped for the same conductivity type as said central layer and having lateral dimensions so as to provide efficient lateral limitation of the current path.

2. A tunable distributive feedback laser according to claim 1 wherein a cover layer which is doped for a conductivity type which is opposite to the conductivity type of said central layer is formed on the side of the layer sequence which faces away from said substrate.

3. A tunable distributive feedback laser according to claim 1 or claim 2 comprising an antimelt-back layer which is formed on said active layer on the side which faces away from said substrate.

4. A tunable distributive feedback laser according to claim 1 or claim 2, wherein said active layer is on the side of said central layer which faces toward said substrate, and said grating is formed by a boundary surface of said tuning layer.

5. A tunable distributive feedback laser according to claim 1 or claim 2 wherein said tuning layer is on the side of said central layer which faces toward said substrate; and in said grating is formed by a boundary surface of said tuning layer.

6. A tunable distributive feedback laser according to claim 1 or claim 2 wherein said active layer is located on the side of said central layer which faces toward said substrate, a grating layer is provided between said active layer and said substrate, and said grating is formed by a boundary surface of said grating layer which faces toward said substrate.

7. A tunable distributive feedback laser according to claim 4 a buffer layer formed of the same material as said substrate and doped for the same conductivity type as said substrate is formed on said substrate, and the remaining layers are formed on said buffer layer.

8. A tunable distributive feedback laser according to claim 1 or claim 2 at least one layer from the group of said active layer and said tuning layer has a structure from the group of quantum well structure, multi-quantum well structure and separate confinement hetero-structure (SCH).

9. A tunable distributive feedback according to claim 1 or claim 2 wherein said main contact layer which is highly doped with the same conductivity type as said substrate is applied on the cover layer, said layer sequence is etched to be strip-shaped, said layer sequence is laterally framed by lateral regions which are grown onto the substrate up to the height of the surface of said main contact layer which faces away from said substrate, said lateral regions are doped for the same conductivity type as said central layer, said lateral regions are dimensioned so as to provide lateral limitation of the current path, electrically insulating passivation regions are formed adjacent to said lateral regions and terminating so as to be flush with the surface, the principal side of the substrate which faces away from the overgrown principal side is provided with said substrate contact said main contact layer is provided with said main contact, and at least one lateral region is provided with said lateral contact.

10. A tunable distributive feedback laser according to claim 9, wherein a lateral contact layer is formed on the surface of said lateral region for lateral contact, said lateral contact layer is highly doped for the same conductivity type as said lateral region, and said lateral contact is respectively applied on said lateral contact layer.

11. A tunable distributive feedback laser according to claim 10, wherein a diffusion region which is adjacent to a part of the surface of said semiconductor layer which is provided with the middle contact is formed, said diffusion region has a conductivity type opposite the conductivity type of said lateral regions, and said diffusion region electrically insulates said middle contact from said lateral regions (8).

12. A tunable distributive feedback laser according to claim, 1 or claim 2 in which the conductivity type of said substrate is p-type and the conductivity type of said central layer is n-type.

13. A tunable DFB laser according to claim 1 or claim 2 wherein the conductivity type of the said substrate is n-type, and the conductivity type of said central layer is p-type.

14. A tunable distributive feedback laser according to claim 9 wherein said substrate, said central layer, said cover layer and said lateral regions are formed of binary material, and said remaining layers are formed of quaternary material.

15. A tunable distributive feedback laser according to claim 14, wherein said binary material is InP and said quaternary material is InGaAsP.

16. A tunable distributive feedback laser according to claim 14 wherein said binary material is InP and said quaternary material is AlGaInAs.

17. A tunable distributive feedback laser according to claim 10 wherein said substrate is GaAs; and in that the remaining layers are $Al_xGa_{1-x}As$ ($0 \times 1$).

18. A tunable distributive feedback laser according to claim 9 wherein said substrate is GaSb; and the remaining layers are composed of the system GaSb/GaInAlAsSb.

19. A tunable distributive feedback laser according to claim 9 wherein said substrate is GaAs; and the remaining layers are InGaAsP.

20. A tunable distributive feedback laser according to claim 1 comprising electrically insulating passivation regions joining said lateral regions laterally and procuring said lateral limitation of the current path.

* * * * *